United States Patent
Cohen et al.

(10) Patent No.: US 9,328,288 B2
(45) Date of Patent: May 3, 2016

(54) RARE-EARTH OXYORTHOSILICATES WITH IMPROVED GROWTH STABILITY AND SCINTILLATION CHARACTERISTICS

(71) Applicant: Siemens Medical Solutions USA, Inc., Malvern, PA (US)

(72) Inventors: Peter Carl Cohen, Knoxville, TN (US); A. Andrew Carey, Lenoir City, TN (US); Mark S. Andreaco, Knoxville, TN (US); Matthias J. Schmand, Lenoir City, TN (US); Brant Quinton, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 14/536,884

(22) Filed: Nov. 10, 2014

(65) Prior Publication Data

US 2015/0136992 A1   May 21, 2015

Related U.S. Application Data

(60) Provisional application No. 61/904,483, filed on Nov. 15, 2013.

(51) Int. Cl.
*G01T 1/20* (2006.01)
*C09K 11/77* (2006.01)
(Continued)

(52) U.S. Cl.
CPC ............ *C09K 11/7774* (2013.01); *C30B 15/00* (2013.01); *C30B 29/34* (2013.01)

(58) Field of Classification Search
CPC ....... G01T 1/202; G01T 1/2023; C30B 29/34; C30B 15/00; C09K 11/7774
USPC ................. 250/362; 252/301.6 R, 301.6
See application file for complete search history.

(56) References Cited

U.S. PATENT DOCUMENTS

| 4,415,401 A | 11/1983 | Wald et al. |
| 4,443,411 A | 4/1984 | Kalejs |
| 4,534,821 A | 8/1985 | Sakaguchi et al. |

(Continued)

FOREIGN PATENT DOCUMENTS

| DE | 69105710 | 9/1995 | |
| KR | 1019950004195 | 4/1995 | |
| WO | WO 2013152434 A2 * | 10/2013 | ............ C30B 29/34 |

OTHER PUBLICATIONS

Derwent translation of WO 2013142434 A2, Zavertyaev Mikhail Vasile, Oct. 2013.*

(Continued)

*Primary Examiner* — David Porta
*Assistant Examiner* — Abra Fein
(74) *Attorney, Agent, or Firm* — Peter Kendall

(57) ABSTRACT

A method for making a rare-earth oxyorthosilicate scintillator single crystal includes growing a single crystal from a melt of compounds including a rare-earth element (such as Lu), silicon and oxygen, a compound including a rare-earth activator (such as Ce), and a compound of a Group-7 element (such as Mn). The method further includes selecting an scintillation performance parameter (such as decay), and based on the scintillation performance parameter to be achieved, doping activator and Group-7 element at predetermined levels, or relative levels between the two, so as to achieve stable growth of the single-crystalline scintillator material from the melt.

14 Claims, 3 Drawing Sheets

(51) Int. Cl.
*C30B 15/00* (2006.01)
*C30B 29/34* (2006.01)

(56) References Cited

U.S. PATENT DOCUMENTS

| | | | |
|---|---|---|---|
| 5,131,974 | A | 7/1992 | Oda et al. |
| 5,164,041 | A | 11/1992 | Berkstresser et al. |
| 5,728,213 | A * | 3/1998 | Kurata .................... C30B 11/00 117/13 |
| 6,210,605 | B1 * | 4/2001 | Srivastava .......... C09K 11/7703 252/301.4 R |
| 6,278,832 | B1 | 8/2001 | Zagumennyi et al. |
| 6,303,048 | B1 | 10/2001 | Kawanaka et al. |
| 6,997,986 | B2 | 2/2006 | Sato |
| 7,297,954 | B2 | 11/2007 | Kurashige et al. |
| 7,618,491 | B2 | 11/2009 | Kurata et al. |
| 8,278,624 | B2 | 10/2012 | Koschan et al. |
| 2003/0021312 | A1 | 1/2003 | Gruzdev et al. |
| 2003/0094889 | A1 | 5/2003 | Imamura et al. |
| 2003/0159643 | A1 | 8/2003 | Sumiya et al. |
| 2004/0017154 | A1 | 1/2004 | Ito et al. |
| 2004/0149201 | A1 | 8/2004 | Sato |
| 2006/0266277 | A1 | 11/2006 | Usui et al. |
| 2006/0288926 | A1 | 12/2006 | Kurata et al. |
| 2007/0001773 | A1 | 1/2007 | Oxborrow |
| 2007/0035813 | A1 | 2/2007 | Roth et al. |
| 2007/0277726 | A1 | 12/2007 | Usui et al. |
| 2007/0292330 | A1 | 12/2007 | Kurata et al. |
| 2008/0089824 | A1 | 4/2008 | Shimura et al. |
| 2011/0038947 | A1 | 2/2011 | Maurer et al. |
| 2011/0050090 | A1 | 3/2011 | Lee et al. |
| 2011/0089580 | A1 | 4/2011 | Hawker et al. |
| 2012/0080645 | A1 | 4/2012 | Andreaco et al. |
| 2012/0126171 | A1 | 5/2012 | Andreaco et al. |
| 2012/0145963 | A1 * | 6/2012 | Andreaco ............... C30B 29/34 252/301.6 R |

OTHER PUBLICATIONS

Suzuki, et al., "UV and gamma-ray excited luminescence of cerium-doped rare-earth oxyorthosilicates", Nuclear Instruments and Methods in Physics Research A320 (1992) pp. 263-272.

Office action in German Patent Application No. 102011115149.8 dated Jun. 27, 2013 (English abstract attached).

Brandle, et al., "Effects of Impurities and Atmosphere on the Growth of Cr-Doped Gadolinium Scandium Gallium Garnet. I," Journal of Crystal Growth 85, pp. 223-228, 1987.

Fratello, et al., "Effects of Impurities and Atmosphere on the Growth of Cr-Doped Gadolinium Scandium Gallium Garnet. II," Journal of Crystal Growth 85, pp. 229-233, 1987.

Hoshino, et al, "Determination of the Thermal Conductivity of Argon and Nitrogen over a Wide Temperature Range Through Data Evaluation and Shock-Tube Experiments", International Journal of Thermophysics, vol. 7, No. 3, pp. 647-662, 1986.

* cited by examiner

RARE-EARTH OXYORTHOSILICATES WITH IMPROVED GROWTH STABILITY AND SCINTILLATION CHARACTERISTICS

CROSS-REFERENCE TO RELATED APPLICATIONS

This application claims the benefit of U.S. Provisional Application Ser. No. 61/904,483, filed 15 Nov. 2013, which provisional application is incorporated herein by reference.

TECHNICAL FIELD

This disclosure relates to radiation detectors employing scintillator materials and particularly to scintillation detectors with improved growth stability and optical characteristics. Certain arrangements also relate to specific components and configurations of such scintillation detectors and method of making the same.

BACKGROUND

Scintillator materials, which emit light pulses in response to impinging radiation, find a wide range of applications, including medical imaging, particle physics and geological exploration. In a typical scintillation detector for radiation detection, a scintillator crystal is coupled to light sensor, such as a photomultiplier tube (PMT), photodiode, or silicon photomultiplier. For single-crystal scintillators, it is often desirable to produce large single-crystals with low concentration of defects, both mechanical and optical. Depending on the application, it is also often desirable to achieve certain scintillation performance characteristics, such as yield and decay time. Efforts have been made to improve the scintillator growth process to reduce the concentrations of the various defects and otherwise improve the performance of scintillator materials and detectors. Nonetheless, there is a continued need for scintillator materials and detectors with improved optical characteristics.

SUMMARY

This disclosure relates to improving the optical performance (such as light output, decay time and time resolution, and low degree of crystal coloration), as well mechanical stability (as reflected in grown crystals that are more optically clear, lacking cracks and other macro defects) during the growth, of rare-earth oxyorthosilicate scintillation detectors, such as LSO:Ce. Such improvements are achieved by co-doping of an activator, such as Ce, and a Group-7 element (IUPAC notation), in particular Mn or Re.

In one example, a method for making a rare-earth oxyorthosilicate scintillator single crystal includes growing a single crystal from a melt of compounds including a rare-earth element (such as Lu), silicon and oxygen, a compound including a rare-earth activator (such as Ce, Pr, Tb, Eu or Yb), and a compound of a Group-7 element (such as Mn or Re). The method further includes selecting an scintillation performance parameter (such as fluorescence decay time in a range of about 25 ns to about 50 ns, about 25 ns to about 42 ns, about 25 ns to about 36 ns, or about 36 ns to about 42 ns); and based on the scintillation performance parameter to be achieved, determining doping levels of activator and Group-7 element, or relative doping levels between the two (such as a range of ratios between Ce and Mn from about 20:1 to about 1:20, from about 20:1 to about 1:4, or from about 4:1 to about 1:4) so as to achieve stable growth of the single-crystalline scintillator material from the melt.

In another example, a scintillator material includes a single crystal of a rare-earth oxyorthosilicate (such as LSO), doped with an activator (such as Ce) and a Group-7 element (such as Mn), wherein the single crystal has a fluorescence decay time in a range of about 25 ns to about 50 ns, about 25 ns to about 42 ns, about 25 ns to about 36 ns, or about 36 ns to about 42 ns. Examples of the relative doping levels of the activator and Group-7 element include a range of ratios between Ce and Mn from about 20:1 to about 1:20, from about 20:1 to about 1:4, or from about 4:1 to about 1:4).

DESCRIPTION

Lutetium oxyorthosilicate (LSO), or $Lu_2SiO_5$ activated with cerium ($Ce^{3+}$), is a well-known crystal scintillator material and widely used for medical imaging, such as gamma-ray detection in positron emission tomography (PET) as well as other applications. Due at least partly to its relatively high light yield and short decay time, LSO is considered to be one of the most suitable materials for molecular imaging applications, specifically for time-of-flight PET (TOF PET). Significant improvement in the performance of TOF PET detectors can be achieved by tuning scintillation characteristics of the LSO by changing its decay time and increasing light output. One of the methods to achieve such improvement is by co-doping.

This disclosure is related to improvement in the performance of rare earth oxyorthosilicates by co-doping with group-7 elements from the periodic table of elements, more specifically with elements such as Mn and Re, more particularly Mn. These elements present in the melt of oxyorthosilicates during crystal growth process are built into the crystal lattice of LSO. Mn ions will most likely occur in the 2+ stable oxidation state (half-filled d-shell) and the molecular structure of $Mn_2SiO_4$ (it is known that manganese orthosilicate is a stable and naturally occurring mineral). Since $Mn^{2+}$ ion has relatively small ionic radii in comparison to other crystal lattice constituents, it can be very easily built-in into the crystal structure of LSO. Its presence creates an additional "free" space, or lattice relaxation, in the crystal lattice allowing other co-dopants, including those with relatively large ionic radii, to be more easily incorporated in the crystal structure. Having an "extra space" in the lattice benefits in lowering stresses and less cracking in crystal usually generated by other larger size codopants such as $Ce^{3+}$, which is a commonly used activator in LSO.

Figure 1:
FIG. 1 shows a single crystal LSO:Ce,Mn scintillator boule grow by the Czochralski method. The Ce doping level is about 0.04 at %; the Mn doping level is about 0.16 at %.

FIG. 1 shows an example of a single crystal boule of LSO doped with Ce and Mn. The boule is substantially optically clear and color-free, indicating a low concentration of cracks and other macroscopic defects and optical defects.

Figure 2A:
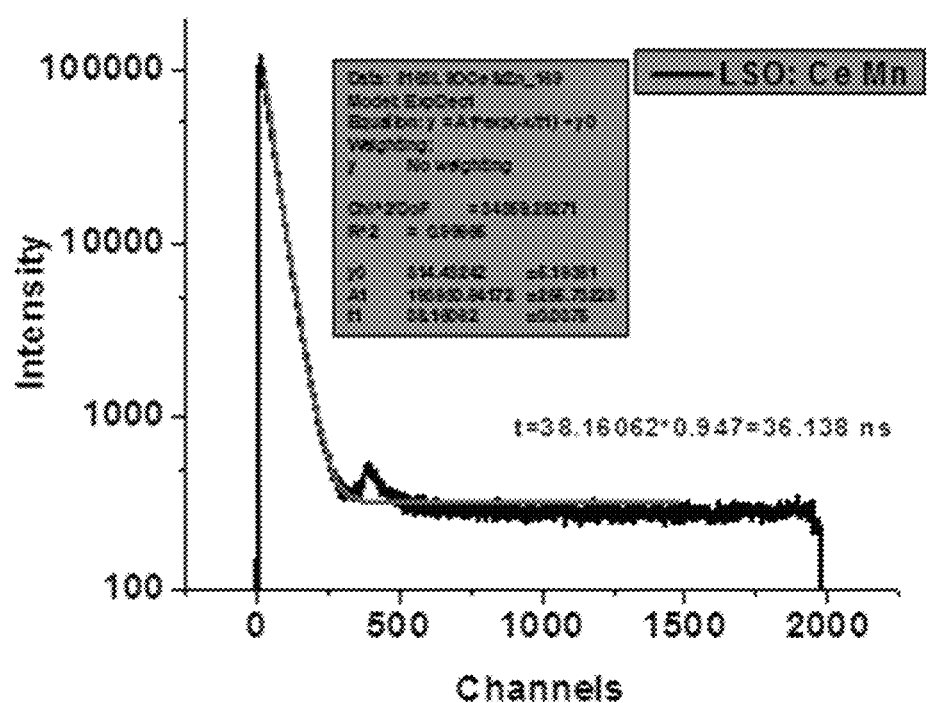
FIG. 2(a) shows a scintillation decay time of $Lu_2SiO_5$:Ce, Mn.
Figure 2B:
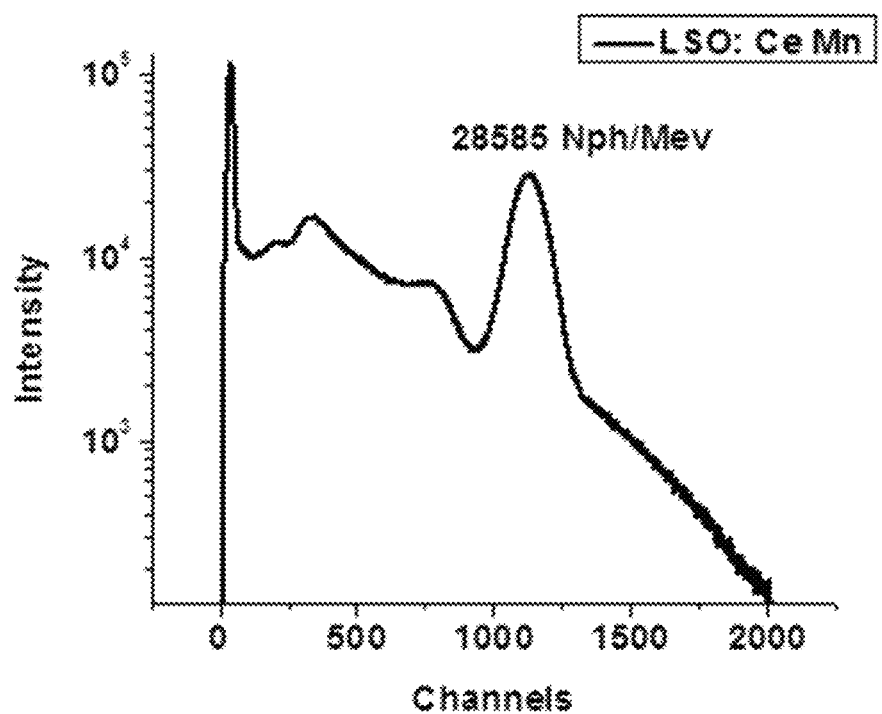
FIG. 2(b) show an energy spectrum of $Lu_2SiO_5$:Ce,Mn.

Another benefit of co-doping with elements Group-7 is a reduction of parasitic effect of electron traps created in the material during crystal growth process. It is commonly understood that electron traps having effective charge states +2 and +1 capture free electrons generated in scintillation process. As a result substantial amount of electrons is excluded from the scintillation mechanism causing a lower light output and strong afterglow. $Mn^{2+}$ ions, on the contrary, reduce the effective cross-section for capturing electrons by traps. That improves scintillation light output and reduces afterglow. FIG. 2 shows a very high light output of LSO crystal co-doped with $Ce^{3+}$ and $Mn^{2+}$ (28,500 ph/MeV "as grown"). $Mn^{2+}$ ions have a very stable half-filled d-shell electron configuration. Optical transitions within d-shell are spin-forbidden but they may produce long decay emissions. These emissions will not interfere with the main scintillation signal, but they will be partially reabsorbed by certain electron traps (optical bleaching effect).

Additionally, $Mn^{2+}$ introduced into the crystal structure with certain concentration ratios (ratio is defined in relation to concentration of a $Ce^{3+}$ activator concentration in the melt) allows one to control the relative distribution of $Ce^{3+}$ ions between two distinct crystallographic sites (see, H. Suzuki, T. A. Tombrello, C. L. Melcher, and J. S. Schweitzer, *Nucl. Instr. and Meth*. A 320 (1992), p. 263) in LSO. In standard lutetium oxyorthosilicate (LSO:$Ce^{3+}$) scintillators, $Ce^{3+}$ populates both crystallographic sites producing scintillation decay time on the order of 42 ns. By co-doping with $Mn^{2+}$ it is possible to enhance the contribution by the cerium site that is characterized by the faster decay time. As a result, overall scintillation decay can be made much shorter than 42 ns (e.g., as short as 25 ns has been observed in Ce,Mn-co-doped LSO). For example, FIG. 2(a) shows short 36 ns scintillation decay due to co-doping with $Mn^{2+}$. Thus, by controlling the doping levels, or relative doping levels, of Ce and Mn, various decay time of LSO scintillator can be achieved. Conversely, based on a selected decay time, doping levels, or relative doping levels, of Ce and Mn, can be determined.

Due to the growth stability provided by Mn (or other Group-7 element) co-doping, large single crystals (for example, 80 mm or greater in diameter, 240 mm or greater in length) of high optical quality can be made. Examples of processes for making co-doped rare-earth oxyorthosilicate single crystals are disclosed in the copending U.S. patent application Ser. No. 12/894,494 and Ser. No. 12/12/953,582, which are incorporated herein by reference.

Generally, component compounds, such as oxides of one or more rare-earth element (e.g., Lu), silica, activator element (e.g., Ce) and Group-7 element (e.g., Mn) can be mixed and heated to make a melt. Alternatively, a powder (including nano-powder) of the co-doped rare-earth oxyorthosilicate substantially of the desired composition can be made into a melt. A single crystal boule can be grown from the melt according to the Czochralski method. The relative amount of the compounds can be chosen at stoichiometric ratios according to the molecular formula of the oxyorthosilicate. Alternatively, there can be excess or deficit amounts of certain elements relative to others. For example, excess or deficit amounts of silica can be included in the starting compounds so that silicon content in the melt is from about 15% less to about 15% more than the stoichiometric amount for $Ln_2SiO_5$ (stoichiometric ratio between Ln and Si being 2:1), where Ln is a rare-earth element such as Lu. For example, Si can be in excess of the stoichiometric amount by from 1% to 15%, from 5% to 15%, or from 10% to 15%; or in deficit of the stoichiometric amount by from 1% to 15%, from 5% to 15%, or from 10% to 15%

In an example method for introducing at least one Group-7 element into a melt, a powdered substance comprising a first rare-earth element is mixed with a powdered silicon oxide such as silica (SiO2). A powdered substance that includes a Group-7 element is added to make a powder mixture. The powdered substance having a first rare-earth element can be a rare-earth oxide or a mixture of such oxides, such as $Lu_2O_8$, $Gd_2O_8$ or $La_2O_3$, or a mixture thereof. An oxide of an additional element, such as $Y_2O_8$, can also be added. The group 7 element can be, but is not limited to, manganese or rhenium. In addition, one or more substances including at least one element from group 2 of the periodic table may be introduced into the mixture. A second powdered substance having a rare-earth activator element can be included in the powder mixture. As an example, a powdered substance including cerium, such as a cerium oxide $CeO_2$, can be introduced into the powder mixture for the purpose of growing an oxyorthosilicate crystal doped with cerium as a scintillator crystal.

The powder mixture is then melted in a crucible to produce a melt. A rare-earth oxyorthosilicate crystal is then grown from the melt.

Oxyorthosilicate crystals can be grown over the following ranges of conditions: temperature from 1900° C. to 2200° C. inclusive, with a seed crystal withdrawn from the melt surface at rates from 0.001 mm/hr to 10 mm/hr inclusive, and rotation rates from 0 to 100 rotations per minute (RPM), inclusive. These ranges are exemplary and under the methods described herein any one or more of these conditions may be varied within or outside these ranges as known in the art. Exemplary cerium-doped lutetium oxyorthosilicate scintillator crystal boules were grown according to certain examples of the method described above. For certain exemplary boules, growth conditions were set as follows: melt temperature about 2100° C., withdrawal rate 3 min/hr, and rotation rate 1 RPM. Crystal boules can be grown to about 80 mm or greater in diameter and about 240 mm or greater in length. Slabs, e.g., of 20 mm in thickness can be cut, and optical measurements can be done, e.g., under excitation with $^{137}Cs$ gamma source (662 keV). The scintillation light can be collected, e.g., using a Hamamatsu R877 photomultiplier.

Thus, scintillators and scintillation detectors with desired optical properties, including selectable decay times, can be made by suitable levels (or relative levels of) co-doping of an activator (such as Ce) with a Group-7 element (such as Mn). Because many embodiments of the invention can be made without departing from the spirit and scope of the invention, the invention resides in the claims hereinafter appended.

We claim:

1. A method of making a single-crystalline rare-earth oxyorthosilicate scintillator material, comprising:
    preparing a melt of a starting material comprising a rare-earth element, silicon, oxygen, an activator element and an IUPAC Group-7 element; and
    growing from the melt a single crystal of an oxyorthosilicate of the rare-earth element doped with the activator element and IUPAC Group-7 element and having a scintillation decay time in a range of about 25 ns to about 42 ns,
    wherein silicon is in excess of the stoichiometric amount by from 1% to 15% relative to the rare-earth element in the starting material.

2. The method of claim 1, further comprising selecting a scintillation decay time in a range of about 25 ns to about 42 ns, and controlling an amount of the IUPAC Group-7 element, or relative amount between the IUPAC Group-7 element and activator element, in the melt based on the selected scintillation decay time.

3. The method of claim 1, wherein the rare-earth element comprises Lu, the activator element comprises a rare-earth activator element and the IUPAC Group-7 element comprises Mn.

4. The method of claim 1, wherein preparing the melt comprises melting the rare-earth oxyorthosilicate doped with the activator element and a the IUPAC Group-7 element.

5. A scintillator material comprising a single crystal of a rare-earth oxyorthosilicate doped with an activator and an IUPAC Group-7 element and having a scintillation decay time in a range of about 25 ns to about 42 ns, wherein silicon is in excess of the stoichiometric amount by from 1% to 15% relative to the rare-earth element in the starting material.

6. The scintillator material of claim 5, wherein the rare-earth oxyorthosilicate comprises lutetium oxyorthosilicate, the activator comprises a rare-earth activator, and the IUPAC Group-7 element comprises Mn.

7. The scintillator material of claim 6, wherein the rare-earth activator comprises $Ce^{3+}$.

8. The scintillator material of claim 6, wherein the rare-earth activator comprises $Pr^{3+}$, $Tb^{3+}$, $Eu^{3+}$, or $Yb^{3+}$.

9. The scintillator material of claim 6, wherein Mn is present in a 2+ oxidation state.

10. The scintillator material of claim 5, wherein the rare-earth oxyorthosilicate comprises lutetium oxyorthosilicate, the activator comprises Ce, and the IUPAC Group-7 element comprises Re.

11. A method of imaging comprising:
   detecting, using a radiation detector, radiation from an object; where the detector comprises a scintillator material comprising:
      a single crystal of a rare-earth oxyorthosilicate doped with an activator and an IUPAC Group-7 element and having a scintillation decay time in a range of about 25 ns to about 42 ns, wherein silicon is in excess of a stoichiometric amount by from 1% to 15% relative to the rare-earth element in the starting material; and
   obtaining an image of the object.

12. The method of claim 11, where the detector is deployed in positron emission tomography (PET), time-of-flight PET (TOF-PET), PET Magnetic resonance (PET MR), computed tomography (CT) or single photon emission computed tomography (SPECT).

13. A method of imaging comprising:
   preparing a melt of a starting material comprising a rare-earth element, silicon, oxygen, an activator element and an IUPAC Group-7 element; and
   growing from the melt a single crystal of an oxyorthosilicate of the rare-earth element doped with the activator element and IUPAC Group-7 element to produce a single-crystalline rare-earth oxyorthosilicate scintillator material that has a scintillation decay time in a range of about 25 ns to about 42 ns, wherein silicon is present in excess of a stoichiometric amount by from 1% to 15% relative to the rare-earth element used in the starting material;
   deploying the single-crystalline rare-earth oxyorthosilicate scintillator material in a detector; and
   imaging an object using the detector.

14. The method of claim 13, further comprising controlling an amount of the IUPAC Group-7 element, or relative amount between the IUPAC Group-7 element and activator element, in the melt based on the selected scintillation decay time.

\* \* \* \* \*